(12) United States Patent
Geng et al.

(10) Patent No.: US 11,538,848 B2
(45) Date of Patent: Dec. 27, 2022

(54) FINGERPRINT IDENTIFICATION SUBSTRATE AND MANUFACTURING METHOD THEREFOR, IDENTIFICATION METHOD AND DISPLAY APPARATUS

(71) Applicants: Beijing BOE Sensor Technology Co., Ltd., Beijing (CN); BOE Technology Group Co., Ltd., Beijing (CN)

(72) Inventors: Yue Geng, Beijing (CN); Cheng Li, Beijing (CN); Zhonghuan Li, Beijing (CN); Kuiyuan Wang, Beijing (CN); Yi Dai, Beijing (CN); Zefei Li, Beijing (CN); Chaoyang Qi, Beijing (CN); Yajie Feng, Beijing (CN); Xiaoguan Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/359,507

(22) Filed: Jun. 26, 2021

(65) Prior Publication Data

US 2022/0165780 A1 May 26, 2022

(30) Foreign Application Priority Data

Nov. 25, 2020 (CN) .......................... 202011345552.8

(51) Int. Cl.
*H01L 27/146* (2006.01)
*G06V 40/13* (2022.01)
(Continued)

(52) U.S. Cl.
CPC ...... *H01L 27/14645* (2013.01); *G06V 10/147* (2022.01); *G06V 40/1318* (2022.01);
(Continued)

(58) Field of Classification Search
CPC ......... H01L 27/14645; H01L 27/14649; H01L 27/14692; H01L 27/307; H01L 27/3225;
(Continued)

(56) References Cited

U.S. PATENT DOCUMENTS 6,320,189 B1 * 11/2001 Ouvrier-Buffet ...... H04N 5/332
250/338.4
2009/0160830 A1 * 6/2009 Omi ...................... G01J 1/4228
257/E31.093

(Continued)

*Primary Examiner* — Abhishek Sarma
(74) *Attorney, Agent, or Firm* — Ling Wu; Stephen Yang; Ling and Yang Intellectual Property

(57) ABSTRACT

Provided a fingerprint identification substrate and a manufacturing method therefor, a identification method, and a display apparatus. The fingerprint identification substrate includes a substrate and at least two kinds of identification pixels disposed on the substrate, a first identification pixel includes a first photodiode and a second identification pixel includes a second photodiode. The first photodiode includes a first electrode, a first photoelectric conversion layer and a second electrode, the second photodiode includes the first electrode, a second photoelectric conversion layer and the second electrode, and the first photoelectric conversion layer and the second photoelectric conversion layer have different spectral response characteristics to red light or infrared light.

14 Claims, 8 Drawing Sheets

(51) Int. Cl.
*G06V 40/12* (2022.01)
*G06V 10/147* (2022.01)
*H01L 27/30* (2006.01)

(52) U.S. Cl.
CPC ...... *G06V 40/1388* (2022.01); *G06V 40/1394* (2022.01); *H01L 27/14649* (2013.01); *H01L 27/14692* (2013.01); *H01L 27/307* (2013.01)

(58) Field of Classification Search
CPC .............. H01L 27/3244; G06V 10/147; G06V 40/1318; G06V 40/1388; G06V 40/1394
See application file for complete search history.

(56) References Cited

U.S. PATENT DOCUMENTS

2014/0312234 A1* 10/2014 Tan ...................... G01J 1/4204
250/208.5
2019/0096928 A1* 3/2019 Okuda ................ H01L 27/1443

* cited by examiner

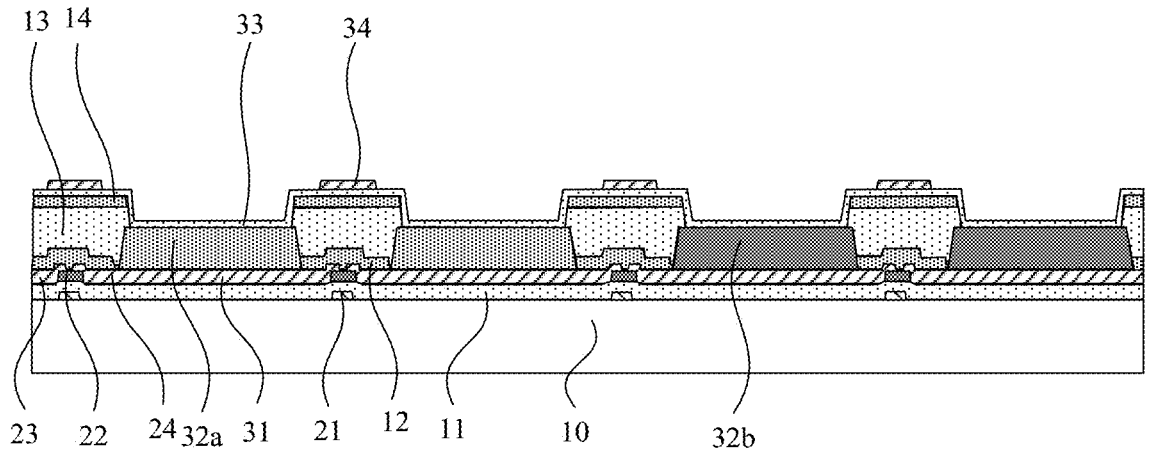

FIG. 16

| Forming a thin film transistor, a first photodiode and a second photodiode on a substrate, the first photodiode including a first electrode, a first photoelectric conversion layer and a second electrode, and the second photodiode including the first electrode, a second photoelectric conversion layer and the second electrode, and the first photoelectric conversion layer and the second photoelectric conversion layer having different spectral response characteristics to red light or infrared light | S1 |

↓

| Forming a power supply line on the second electrode | S2 |

FIG. 17

FINGERPRINT IDENTIFICATION SUBSTRATE AND MANUFACTURING METHOD THEREFOR, IDENTIFICATION METHOD AND DISPLAY APPARATUS

CROSS-REFERENCE TO RELATED APPLICATION

The present application claims the priority of Chinese Patent Application No. 202011345552.8 filed to the CNIPA on Nov. 25, 2020, the content of which is hereby incorporated by reference.

TECHNICAL FIELD

Embodiments of the present disclosure relate to, but are not limited to, the field of display technology, and particularly relate to a fingerprint identification substrate and a manufacturing method therefor, an identification method and a display apparatus.

BACKGROUND

Fingerprint identification has become a function of most display terminals such as mobile phones, tablet computers and notebook computers. At present, fingerprint identification of a display apparatus is gradually changing from capacitive fingerprint identification to optical fingerprint identification. The optical fingerprint identification uses refraction and reflection of light to image user's fingerprint, and then uses an image identification method to identification fingerprint features. It has the characteristics of high imaging resolution and easy image identification, and may be set below a display screen to form fingerprint identification under the screen.

However, due to a low identification ability of the optical fingerprint identification to a difference of reflectivity of lines, it is difficult for current optical fingerprint identification products to distinguish between real and fake fingerprints. The fake fingerprints include three-dimensional fingerprint film made of organic materials and two-dimensional plane printed fingerprints. Therefore, current optical fingerprint identification products have poor security and low reliability.

SUMMARY

The following is a summary of subject matters described in detail in the present disclosure. This summary is not intended to limit the protection scope of the claims.

Embodiments of the present disclosure provide a fingerprint identification substrate, including a substrate and at least two kinds of identification pixels disposed on the substrate, the at least two kinds of identification pixels including a first identification pixel and a second identification pixel, and the first identification pixel including a first photodiode and the second identification pixel including a second photodiode.

The first photodiode includes a first electrode, a first photoelectric conversion layer and a second electrode, and the second photodiode includes the first electrode, a second photoelectric conversion layer and the second electrode; and the first photoelectric conversion layer and the second photoelectric conversion layer have different spectral response characteristics to red light or infrared light.

In an exemplary embodiment, the first photoelectric conversion layer responds to all visible light bands; the second photoelectric conversion layer only responds to a blue-green band.

In an exemplary embodiment, the first photoelectric conversion layer includes a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon; and the second photoelectric conversion layer is made of perovskite material.

In an exemplary embodiment, the first photoelectric conversion layer responds to all visible light bands; and the second photoelectric conversion layer only responds to an infrared band.

In an exemplary embodiment, the first photoelectric conversion layer includes a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon; and the second photoelectric conversion layer is made of a derivative of near infrared fluorescent dye or full carbon molecular material.

In an exemplary embodiment, the first photoelectric conversion layer responds to all visible light bands, the second photoelectric conversion layer responds to all visible light bands, and a response peak value of the first photoelectric conversion layer is different from a response peak value of the second photoelectric conversion layer.

In an exemplary embodiment, the first photoelectric conversion layer includes a first doped layer, a first intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon; the second photoelectric conversion layer includes a third doped layer, a second intrinsic layer and a fourth doped layer which are stacked, wherein the third doped layer is made of P-type doped amorphous silicon or polycrystalline silicon, and the fourth doped layer is made of N-type doped amorphous silicon or polycrystalline silicon; or, the third doped layer is made of N-type doped amorphous silicon or polycrystalline silicon, and the fourth doped layer is made of P-type doped amorphous silicon or polycrystalline silicon; and the first intrinsic layer and the second intrinsic layer have different thicknesses.

Embodiments of the present disclosure also provide a display apparatus, including a fingerprint identification substrate. The fingerprint identification substrate includes a substrate and at least two kinds of identification pixels disposed on the substrate, the at least two kinds of identification pixels includes a first identification pixel and a second identification pixel, and the first identification pixel includes a first photodiode and the second identification pixel includes a second photodiode.

The first photodiode includes a first electrode, a first photoelectric conversion layer and a second electrode, and the second photodiode includes the first electrode, a second photoelectric conversion layer and the second electrode.

The first photoelectric conversion layer and the second photoelectric conversion layer have different spectral response characteristics to red light or infrared light.

In an exemplary embodiment, the first photoelectric conversion layer responds to all visible light bands; the second photoelectric conversion layer only responds to a blue-green band.

In an exemplary embodiment, the first photoelectric conversion layer includes a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon.

The second photoelectric conversion layer is made of perovskite material.

In an exemplary embodiment, the first photoelectric conversion layer responds to all visible light bands; and the second photoelectric conversion layer only responds to an infrared band.

In an exemplary embodiment, the first photoelectric conversion layer includes a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon.

The second photoelectric conversion layer is made of a derivative of near infrared fluorescent dye or full carbon molecular material.

In an exemplary embodiment, the first photoelectric conversion layer responds to all visible light bands, the second photoelectric conversion layer responds to all visible light bands, and a response peak value of the first photoelectric conversion layer is different from a response peak value of the second photoelectric conversion layer.

In an exemplary embodiment, the first photoelectric conversion layer includes a first doped layer, a first intrinsic layer and a second doped layer which are stacked, wherein the first doped layer is made of P-type doped amorphous silicon or polycrystalline silicon, and the second doped layer is made of N-type doped amorphous silicon or polycrystalline silicon; or, the first doped layer is made of N-type doped amorphous silicon or polycrystalline silicon, and the second doped layer is made of P-type doped amorphous silicon or polycrystalline silicon.

The second photoelectric conversion layer includes a third doped layer, a second intrinsic layer and a fourth doped layer which are stacked, wherein the third doped layer is made of P-type doped amorphous silicon or polycrystalline silicon, and the fourth doped layer is made of N-type doped amorphous silicon or polycrystalline silicon; or, the third doped layer is made of N-type doped amorphous silicon or polycrystalline silicon, and the fourth doped layer is made of P-type doped amorphous silicon or polycrystalline silicon.

The first intrinsic layer and the second intrinsic layer have different thicknesses.

Embodiments of the present disclosure also provide a manufacturing method for a fingerprint identification substrate, including: forming a thin film transistor, a first photodiode and a second photodiode on a substrate, the first photodiode including a first electrode, a first photoelectric conversion layer and a second electrode, and the second photodiode including the first electrode, a second photoelectric conversion layer and the second electrode, and the first photoelectric conversion layer and the second photoelectric conversion layer having different spectral response characteristics to red light or infrared light; and forming a power supply line on the second electrode.

In an exemplary embodiment, the forming a thin film transistor, a first photodiode and a second photodiode on a substrate includes: forming a first conductive layer on the substrate, the first conductive layer including a gate electrode; forming a first insulating layer and an active layer on the first conductive layer; forming a second conductive layer on the active layer, the second conductive layer including a source electrode, a drain electrode and the first electrode, and the gate electrode, the active layer, the source electrode and the drain electrode constituting the thin film transistor; forming a second insulating layer on the second conductive layer, the second insulating layer being provided with a via hole exposing a surface of the first electrode; forming the first photoelectric conversion layer and the second photoelectric conversion layer on the second insulating layer, the first photoelectric conversion layer being connected with the first electrode through the via hole on the second insulating layer, and the second photoelectric conversion layer being connected with the first electrode through the via hole on the second insulating layer; forming a flattening layer, a third insulating layer and the second electrode on the first photoelectric conversion layer and the second photoelectric conversion layer, the second electrode being connected with the first photoelectric conversion layer and the second photoelectric conversion layer through via holes penetrating through the flattening layer and the third insulating layer, and the first electrode, the first photoelectric conversion layer and the second electrode constituting the first photodiode, and the first electrode, the second photoelectric conversion layer and the second electrode constituting the second photodiode.

In an exemplary embodiment, the first photoelectric conversion layer responds to all visible light bands; the second photoelectric conversion layer only responds to a blue-green band; or the first photoelectric conversion layer responds to all visible light bands, and the second photoelectric conversion layer only responds to an infrared band; or the first photoelectric conversion layer responds to all visible light bands, and the second photoelectric conversion layer responds to all visible light bands, and a response peak value of the first photoelectric conversion layer is different from a response peak value of the second photoelectric conversion layer.

Embodiments of the present disclosure also provide a identification method for a fingerprint identification substrate, including: determining a dynamic sensitive region and a non-dynamic sensitive region in a fingerprint image, a spectral response of the dynamic sensitive region to red light or infrared light being greater than a spectral response of the non-dynamic sensitive region to the red light or the infrared light; collecting two or more fingerprint images; detecting whether a grayscale fluctuation between a subsequent collected fingerprint image and a previous collected fingerprint image in the dynamic sensitive region satisfies a preset grayscale fluctuation condition; determining that the collected fingerprint image is a fingerprint image of a real finger when the preset grayscale fluctuation condition is satisfied; and determining that the collected fingerprint image is a fingerprint image of a fake finger when the preset grayscale fluctuation condition is not satisfied.

In an exemplary embodiment, the preset grayscale fluctuation condition includes: a grayscale fluctuation value between the subsequent collected fingerprint image and the previous collected fingerprint image in the dynamic sensitive region are greater than or equal to a first grayscale fluctuation threshold; or grayscale values of continuously collected a plurality of frames of the fingerprint images having a periodic grayscale vibration consistent with a pulse vibration frequency.

Other features and advantages of the present disclosure will be set forth in the following specification, and will become apparent partially from the specification, or be understood by practice of the present disclosure. Other advantages of the present disclosure may be realized and obtained by the solutions described in the specification and drawings.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain the technical solutions of the present disclosure and do not constitute a limitation on the technical solutions of the present disclosure.

FIG. 16 is a schematic diagram after forming a pattern of a power supply line according to an exemplary embodiment of the present disclosure;

FIG. 17 is a flowchart of a manufacturing method for a fingerprint identification substrate according to an exemplary embodiment of the present disclosure.

DETAILED DESCRIPTION

Figure 1:
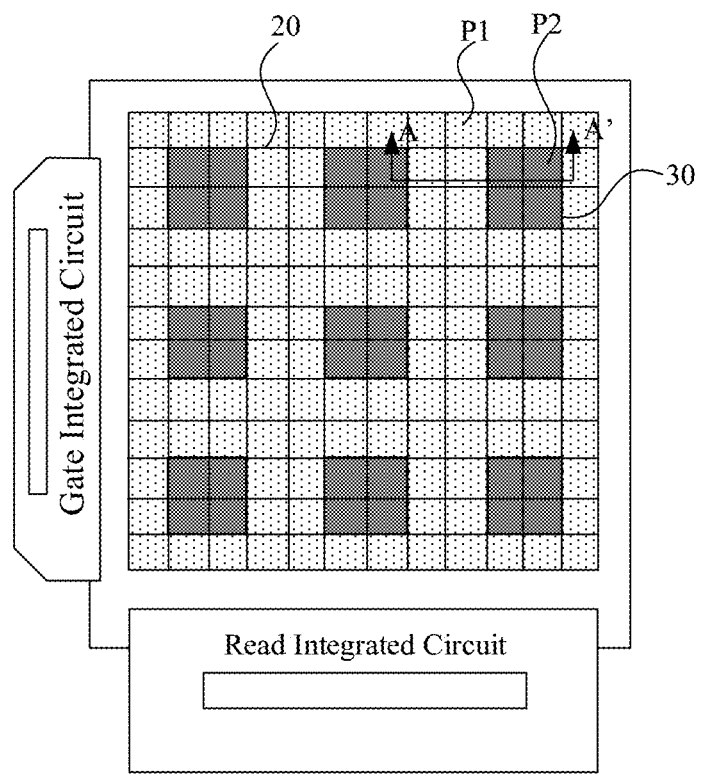
FIG. 1 is a schematic diagram of a structure of a fingerprint identification substrate according to an exemplary embodiment of the present disclosure.

A plurality of embodiments are described in the present disclosure, but the description is exemplary rather than restrictive, and it is apparent to those of ordinary skills in the art that there may be more embodiments and implementation solutions within the scope of the embodiments described in the present disclosure. Although many possible combinations of features are shown in the drawings and discussed in the embodiments, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any conventional features or elements to form a unique technical solution defined by the claims. Any feature or element of any embodiment may also be combined with features or elements from other technical solutions to form another unique technical solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, one or more modifications and alterations may be made within the protection scope of the appended claims.

Furthermore, when describing representative embodiments, the specification may have presented a method or process as a specific order of acts. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. Furthermore, the claims for the method or process should not be limited to performing the acts in the order of its acts, and those skilled in the art can easily understand that these orders may be varied but still remain within the essence and scope of the embodiments of the present disclosure.

Hereinafter, embodiments will be described with reference to the drawings. The embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments.

In the drawings, the size of each constituent element, or the thickness or area of a layer, is sometimes exaggerated for clarity. Therefore, an implementation of the present disclosure is not necessarily limited to the size shown, and a shape and size of each component in the drawings do not reflect true proportions. In addition, the drawings schematically show ideal examples, and an implementation of the present disclosure is not limited to the shapes or numerical values shown in the drawings.

The "first", "second", "third" and other ordinal numbers in the present disclosure are used to avoid confusion of constituent elements, not to provide any quantitative limitation. In the present disclosure, "a plurality of" may mean two or more than two.

In the present disclosure, for the sake of convenience, wordings such as "central", "upper", "lower", "front", "rear", "vertical", "horizontal", "top", "bottom", "inner", "outer" and the others describing the orientations or positional relations are used to depict relations of elements with reference to the drawings, which are only for an easy and simplified description of the present disclosure, rather than for indicating or implying that the device or element referred to must have a specific orientation, or must be constructed and operated in a particular orientation and therefore, those wordings cannot be construed as limitations on the present disclosure. It may be understood that when an element such as a layer, film, region or substrate is referred to as being "on" or "under" another element, the element may be "directly" "on" or "under" another element, or there may be a middleware. The positional relations of the constituent elements may be appropriately changed according to the direction in which constituent elements are described. Therefore, they are not limited to the wordings in the specification, and may be replaced appropriately according to the situations.

In the present disclosure, similar terms such as "connect", "couple" or "link" are not limited to physical or mechanical connections, but may include direct or indirect electrical connections. "Electrical connection" includes a case where constituent elements are connected together through an element with certain electrical effects. The "element having a certain electrical action" is not particularly limited as long as it can transmit and receive electrical signals between connected constituent elements. Examples of the "element having a certain electrical action" not only include electrodes and wirings, but also include switching elements such as transistors, resistors, inductors, capacitors, and other elements with one or more functions.

In the present disclosure, "film" and "layer" are interchangeable. For example, sometimes "conductive layer" may be replaced by "conductive film". Similarly, "insulating film" may sometimes be replaced by "insulating layer".

In the present disclosure, for example, when the conductivity is sufficiently low, sometimes "semiconductor" has the characteristics of "insulator". In addition, because the boundary between "semiconductor" and "insulator" is not clear, it is sometimes impossible to accurately distinguish "semiconductor" from "insulator". Therefore, "semiconductor" in the present disclosure may sometimes be replaced by "insulator". Similarly, "insulator" in the present disclosure may sometimes be replaced by "semiconductor". In addition, "insulator" in the present disclosure may sometimes be replaced by "semi-insulator".

In the present disclosure, for example, when the conductivity is sufficiently high, sometimes "semiconductor" has the characteristics of "conductor". In addition, because the boundary between "semiconductor" and "conductor" is not clear, it is sometimes impossible to accurately distinguish "semiconductor" from "conductor". Therefore, "semiconductor" in the present disclosure may sometimes be replaced by "conductor". Similarly, "conductor" in the present disclosure may sometimes be replaced by "semiconductor".

In the present disclosure, a transistor refers to an element including at least three terminals, namely, a gate electrode, a drain electrode and a source electrode. The transistor has a channel region between the drain electrode (a drain electrode terminal, a drain region or a drain electrode) and the source electrode (a source electrode terminal, a source region or a source electrode), and a current may flow through the drain electrode, the channel region and the source electrode. In the present disclosure, the channel region refers to a region through which the current mainly flows.

The functions of the "source electrode" and that of the "drain electrode" are interchangeable under circumstances where transistors with opposite polarities are used or where the current direction changes during circuit operation. Therefore, in the present disclosure, "the source electrode" and "the drain electrode" are interchangeable.

Those skilled in the art may understand that switching transistors and driving transistors used in all embodiments of the present disclosure may be thin film transistors or field-effect transistors or other devices with same characteristics. The thin film transistor used in the embodiments of the present disclosure may be an oxide semiconductor transistor. Since a source and a drain of a switching transistor used here are symmetrical, the source and the drain may be interchanged. In the embodiments of the present disclosure, a control electrode of the switching transistor is a gate, and one of two electrodes of the switching transistor other than the gate is referred to as a first electrode and the other electrode is referred to as a second electrode to distinguish the two electrodes. The first electrode may be a source or a drain, and the second electrode may be the drain or the source.

A fingerprint identification substrate includes a plurality of identification pixels arranged in a matrix, and each of the identification pixels has the same spectral response characteristics. Since all identification pixels have the same sensitivity to dynamic changes of fingerprints, grayscale changes of each pixel may not be obviously presented in a fingerprint image. This kind of subtle grayscale changes may easily be masked by operations such as denoising, grayscale stretching, etc. in a later fingerprint comparison algorithm, so that it cannot represent a significant difference from fake fingerprints.

In recent years, people pay more and more attention to personal information security. For scenarios such as payment confirmation, transfer confirmation and identity confirmation by fingerprints, a safer way than simply recognizing fingerprint features is needed. For a human body, the biggest difference between a real finger and a fake finger in that structures of inner layers of theirs fingerprint surfaces are different. For example, a finger vein identification method that has been proposed uses the difference in vein textures inside fingers between people for identification. According to an embodiment of the present disclosure, a more reliable and safer fingerprint identification method is provided by utilizing a characteristic that the real finger has different dynamic changes from the fake finger and determining whether an image is the real finger based on whether the image will be dynamically changed.

An embodiment of the present disclosure provides a fingerprint identification substrate. In an exemplary embodiment, the fingerprint identification substrate may include a substrate, a first identification pixel and a second identification pixel which are disposed on the substrate. The first identification pixel includes a first photodiode and the second identification pixel includes a second photodiode. The first photodiode includes a first electrode, a first photoelectric conversion layer and a second electrode, and the second photodiode includes the first electrode, a second photoelectric conversion layer and the second electrode. The first photoelectric conversion layer and the second photoelectric conversion layer have different spectral response characteristics to red light or infrared light.

Figure 2:
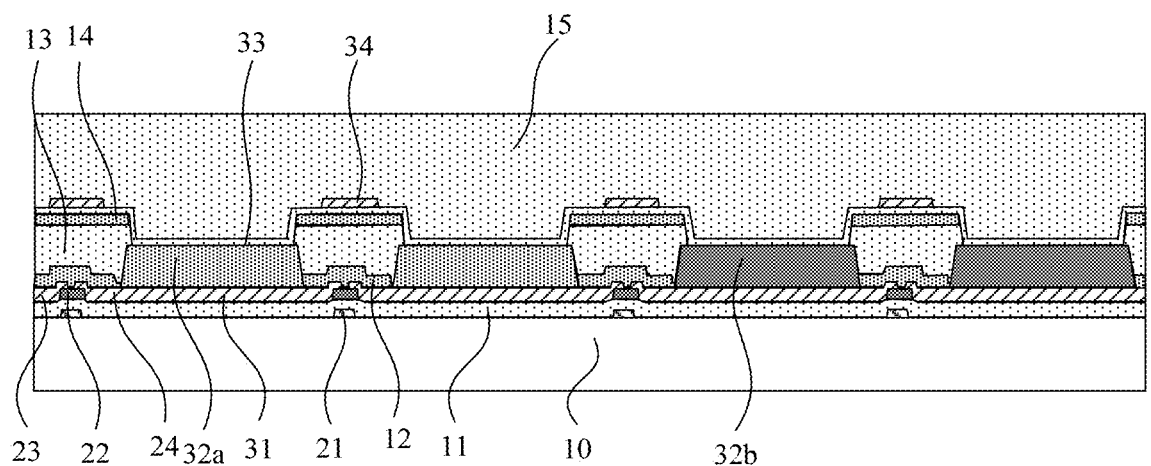
FIG. 2 is a sectional view taken along an A-A direction in FIG. 1.
Figure 3:
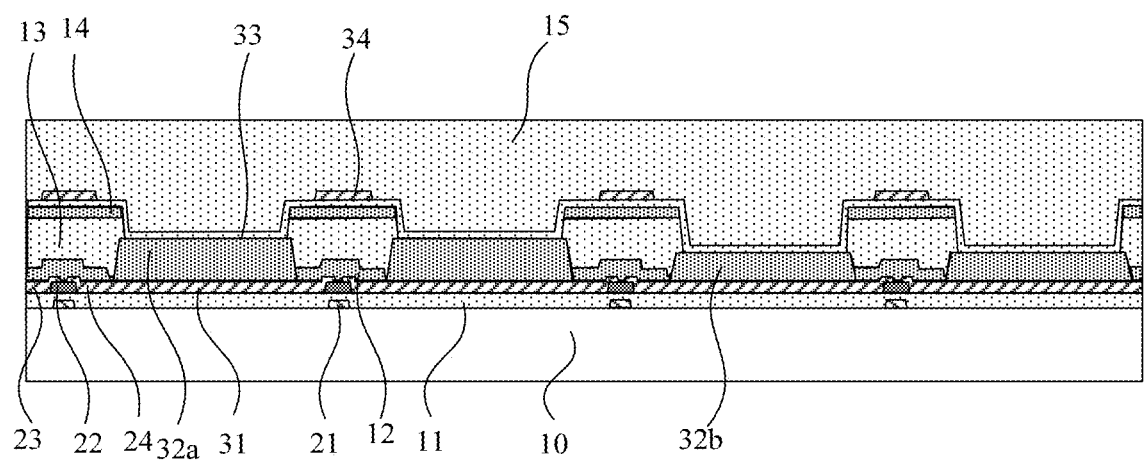
FIG. 3 is another sectional view taken along an A-A direction in FIG. 1.

FIG. 1 is a schematic diagram of a structure of a fingerprint identification substrate according to an exemplary embodiment of the present disclosure, FIG. 2 is a sectional view taken along an A-A direction of the fingerprint identification substrate in FIG. 1, FIG. 3 is another sectional view taken along an A-A direction of the fingerprint identification substrate in FIG. 1. As shown in FIG. 1 to FIG. 3, the fingerprint identification substrate includes a substrate 10, a plurality of scanning signal lines 20 and a plurality of data signal lines 30 which are arranged on the substrate 10, the plurality of scanning signal lines 20 and the plurality of data signal lines 30 intersects each other to form a plurality of identification pixels arranged in a matrix. In an exemplary implementation, the intersection of the scanning signal lines 20 and the data signal lines 30 in the exemplary embodiment of the present disclosure means that the projections of the scanning signal lines 20 and the data signal lines 30 on the substrate 10 perpendicularly intersect, while the scanning signal lines 20 and the data signal lines 30 are not in direct contact due to an insulating layer. At least one identification pixel includes a fingerprint sensing layer disposed on the substrate 10, and the fingerprint sensing layer includes a thin film transistor and a photodiode. The thin film transistor may include a gate electrode 21, an active layer 22, a source electrode 23, and a drain electrode 24, and the photodiode may include a first electrode 31, a photoelectric conversion layer 32, and a second electrode 33. The fingerprint identification substrate may include a identification pixel array of hundreds of rows and hundreds of columns, and the identification pixel array constitutes a photosensitive region of the fingerprint identification substrate.

In an exemplary embodiment, the plurality of identification pixels includes a first identification pixel P1 and a second identification pixel P2. The first identification pixel P1 includes a thin film transistor and a first photodiode, and the second identification pixel P2 includes a thin film transistor and a second photodiode. The first photodiode may include a first electrode 31, a first photoelectric conversion layer 32a, and a second electrode 33, the second photodiode may include the first electrode 31, a second photoelectric conversion layer 32b, and the second electrode 33. The first photoelectric conversion layer 32a and the second photoelectric conversion layer 32b have different spectral response characteristics to red light or infrared light.

Figure 4:
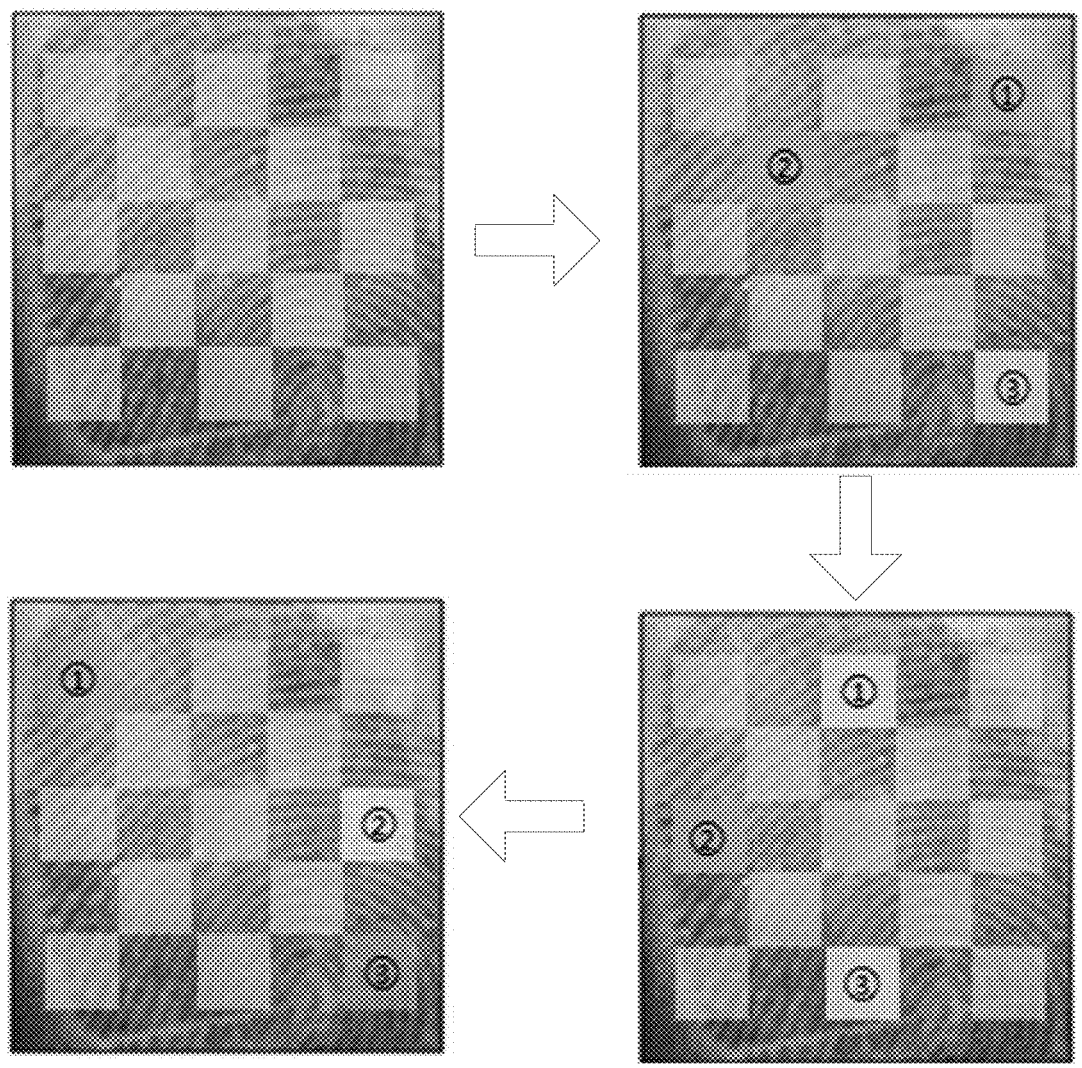
FIG. 4 is a schematic diagram of a dynamic image of four frames of real fingerprints according to an exemplary embodiment of the present disclosure.

In the embodiment of the present disclosure, two or more kinds of identification pixels with different spectral response characteristics are disposed on the fingerprint identification substrate, and these different spectral response characteristics may be realized by various processes. Taking two kinds of identification pixels as an example, an exemplary arrangement is shown in FIG. 1, where P1 and P2 represent two kinds of identification pixels with different spectral response characteristics, and their fingerprint imaging is shown in FIG. 4. Due to different spectral response characteristics, the grayscale level of each region is different, and the overall appearance is in the form of a checkerboard. In the embodiment of the present disclosure, different kinds of identification pixels have different sensitivity to dynamic changes of fingerprints. Among them, some kinds of identification pixels are relatively more sensitive to the dynamic changes of fingerprints, while others are less sensitive to the dynamic changes of fingerprints, which will enlarge a degree of dynamic changes of grayscale in each region of a fingerprint image. FIG. 4 illustrates a dynamic image of four frames of real fingerprints, regions numbered ①, ②, ③ in each figure are fingerprint dynamic change region that may be distinguished significantly. For this continuous multi-frame dynamic fingerprint image, in the fingerprint comparison algorithm, a certain determination threshold may be set. For example, it is specified that a grayscale fluctuation range of the pixel region sensitive to the dynamic changes of the fingerprint is greater than a certain value, or it is analyzed whether there are periodic grayscale vibrations such as pulses in the dynamically changing regions in multiple frames of continuous images, and it is determined whether it is a real fingerprint in a similar way.

In an exemplary embodiment, the scanning signal lines 20 are connected with a gate integrated circuit (Gate IC) of an external circuit, and the data signal lines 30 are connected with a read integrated circuit (ROIC) of the external circuit. The gate integrated circuit sends a fingerprint identification scanning signal to the scanning signal lines 20, and the read integrated circuit reads an electrical signal from the data signal lines 30.

Figure 5:
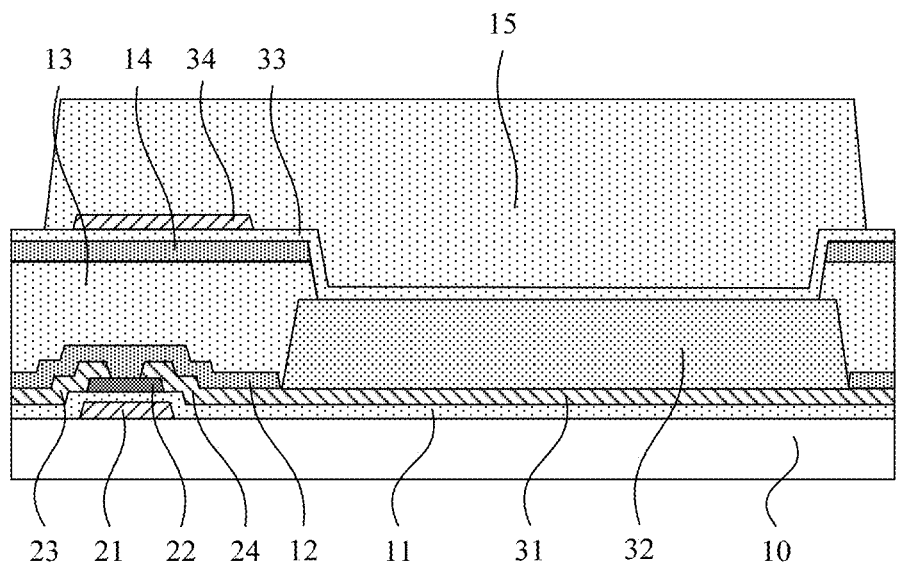
FIG. 5 is a schematic diagram of a structure of a single identification pixel according to an exemplary embodiment of the present disclosure.

In an exemplary embodiment, as shown in FIG. 5, a thin film transistor and a photodiode in a fingerprint sensing layer are synchronously manufactured on a substrate 10. In the thin film transistor and photodiode synchronously manufactured, a drain electrode 24 of the thin film transistor and a first electrode 31 of the photodiode may be disposed on the same layer and formed by the same patterning process. In an exemplary embodiment, the drain electrode 24 and the first electrode 31 are connected with each other as an integrated structure.

In an exemplary embodiment, as shown in FIG. 5, the fingerprint sensing layer further includes a second insulating layer 12 covering the thin film transistor, which is provided with a first via hole exposing the first electrode 31 of the photodiode, and a photoelectric conversion layer 32 of the photodiode is connected with the first electrode 31 of the photodiode through the first via hole.

In an exemplary embodiment, as shown in FIG. 5, the fingerprint sensing layer further includes a flattening layer 13 and a third insulating layer 14 covering the second insulating layer 12 and the photoelectric conversion layer 32, and the flattening layer 13 and the third insulating layer 14 are provided with a second via hole exposing the photoelectric conversion layer 32 of the photodiode. A second electrode 33 of the photodiode is disposed on the third insulating layer 14, and is connected with the photoelectric conversion layer 32 of the photodiode through the second via hole.

In an exemplary embodiment, as shown in FIG. 5, the second electrode 33 of the photodiode is provided with a power supply line 34, and an orthogonal projection of the power supply line 34 on the substrate 10 includes an orthogonal projection of a channel region of the thin film transistor on the substrate 10.

In an exemplary embodiment, a first photoelectric conversion layer 32a and a second photoelectric conversion layer 32b have different spectral response characteristics to red light or infrared light, which may be realized by the following ways: the first photoelectric conversion layer 32a and the second photoelectric conversion layer 32b are made of photoelectric semiconductor materials with different spectral response intervals, or the first photoelectric conversion layer 32a and the second photoelectric conversion layer 32b are made of the same photoelectric semiconductor material, but process parameters of the first photoelectric conversion layer 32a are different from process parameters of the second photoelectric conversion layer 32b.

In an exemplary embodiment, the first photoelectric conversion layer 32a is made of a first photoelectric semiconductor material, which responds to all visible light bands. The second photoelectric conversion layer 32b is made of a second photoelectric semiconductor material, which only responds to a blue-green band.

In an exemplary embodiment, the first photoelectric conversion layer 32a may include a first doped layer, an intrinsic layer and a second doped layer which are stacked, the first doped layer may be made of P-type doped amorphous silicon or polycrystalline silicon, and the second doped layer may be made of N-type doped amorphous silicon (a-Si) or polycrystalline silicon (P-Si); or, the first doped layer may be made of N-type doped amorphous silicon or polycrystalline silicon, and the second doped layer may be made of P-type doped amorphous silicon or polycrystalline silicon; the second photoelectric conversion layer 32b may be made of perovskite material.

Figure 6:
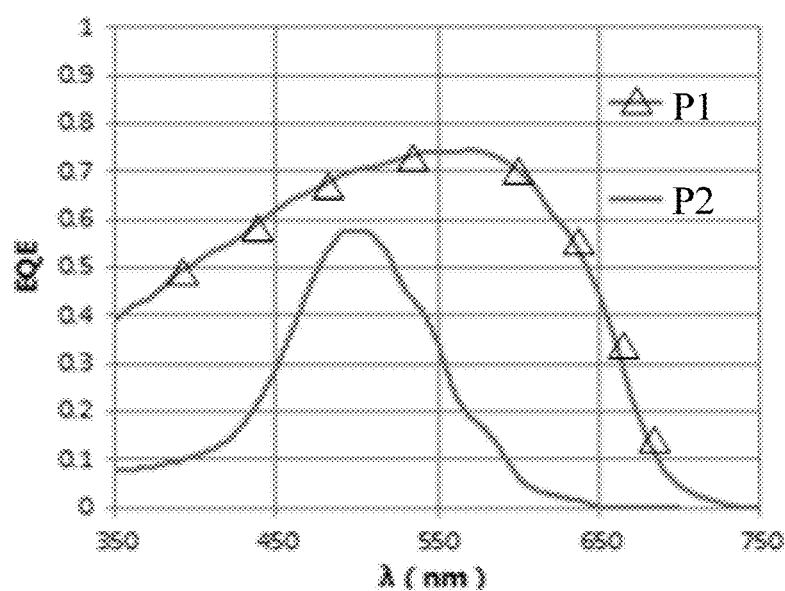
FIG. 6 is a schematic diagram of spectral response curves of two kinds of identification pixels according to an exemplary embodiment of the present disclosure.

In this exemplary embodiment, two kinds of identification pixels with different spectral responses are formed by photoelectric conversion layers made of different photoelectric semiconductor materials. Spectral response curves of the two kinds of identification pixels are shown in FIG. 6, in which the first identification pixel P1 responds to all visible light bands, and may be made of materials such as p/i/n doped a-Si/p-Si, and the second identification pixel P2 responds to only a blue-green band, and may be made of the perovskite material.

For this exemplary embodiment, white light may be used as an emission light source when distinguishing between real and fake fingerprints. For a real finger, its biological characteristics cause the dynamic change of the response to a red light band to be significantly higher than that to a blue-green light band. When determining the change of multi-frame images of the real finger, the second identification pixel P2 only responds to the blue-green light band obviously, so there is no significant change in an region of the second identification pixel P2 between multi-frame images, while the first identification pixel P1 may represent dynamic change between each frame image because it responds to the red light band. This embodiment uses a conventional white light source, which may be used in the fields of mobile phone fingerprint or security authentication.

In another exemplary embodiment, the first photoelectric conversion layer 32a is made of the first photoelectric semiconductor material, which responds to all visible light bands; the second photoelectric conversion layer 32b is made of a third photoelectric semiconductor material, which only responds to an infrared band.

In an exemplary embodiment, the first photoelectric conversion layer 32a may include a first doped layer, an intrinsic layer and a second doped layer which are stacked, the first doped layer may be made of P-type doped amorphous silicon or polycrystalline silicon, and the second doped layer may be made of N-type doped amorphous silicon or polycrystalline silicon; or, the first doped layer may be made of N-type doped amorphous silicon or polycrystalline silicon, and the second doped layer may be made of P-type doped amorphous silicon or polycrystalline silicon.

The second photoelectric conversion layer 32b may be made of a derivative of near infrared fluorescent dye (Cyanine 7-P, CY7-P) or all carbon molecular material (C60).

Figure 7:
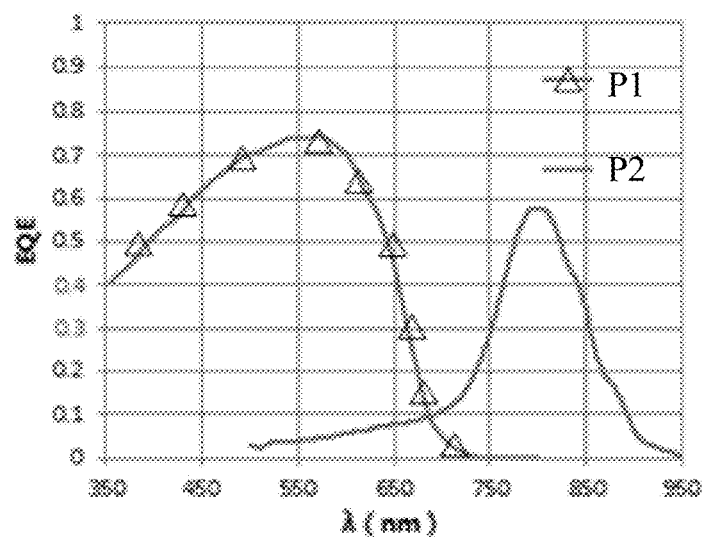
FIG. 7 is a schematic diagram of another spectral response curves of two kinds of identification pixels according to an exemplary embodiment of the present disclosure.

In this exemplary embodiment, two kinds of identification pixels with different spectral responses are formed by photoelectric conversion layers made of different photoelectric semiconductor materials. Spectral response curves of the two kinds of identification pixels are shown in FIG. 7, in which the first identification pixel P1 responds to all visible light bands and may be made of materials such as p/i/n doped a-Si/p-Si, and the second identification pixel P2 responds to only an infrared band and may be made of a derivative of organic semiconductor materials such as Cy7-P and C60.

For this embodiment, infrared light may be used as an emission light source when distinguishing between real and fake fingerprints. When determining the change of multi-frame images of a real finger, since the first identification pixel P1 has a low response to the infrared light band, a region of the first identification pixel P1 changes little between the multi-frame images, while the second identification pixel P2 may represent dynamic changes between each frame image because of responding to the infrared light. This embodiment uses the infrared light source, which is suitable for security authentication and other fields. If a structure of a display apparatus such as a mobile phone allows a space for the infrared light source, it may also be used as a fingerprint identification component of the display apparatus such as the mobile phone.

In another exemplary embodiment, the first photoelectric conversion layer 32a and the second photoelectric conversion layer 32b are made of the first photoelectric semiconductor material, which responds to all visible light bands, and a response peak of the first photoelectric conversion layer 32a is different from a response peak of the second photoelectric conversion layer 32b.

In an exemplary embodiment, the first photoelectric conversion layer 32a may include a first doped layer, a first intrinsic layer and a second doped layer which are stacked, the first doped layer may be made of P-type doped amorphous silicon or polycrystalline silicon, and the second doped layer may be made of N-type doped amorphous silicon or polycrystalline silicon; or, the first doped layer may be made of N-type doped amorphous silicon or polycrystalline silicon, and the second doped layer may be made of P-type doped amorphous silicon or polycrystalline silicon.

The second photoelectric conversion layer 32b may include a third doped layer, a second intrinsic layer and a fourth doped layer which are stacked, the third doped layer may be made of P-type doped amorphous silicon or polycrystalline silicon, and the fourth doped layer may be made of N-type doped amorphous silicon or polycrystalline silicon; or, the third doped layer may be made of N-type doped amorphous silicon or polycrystalline silicon, and the fourth doped layer may be made of P-type doped amorphous silicon or polycrystalline silicon.

The first intrinsic layer and the second intrinsic layer have different thicknesses.

In this exemplary embodiment, a thickness of each of the first intrinsic layer and the second intrinsic layer ranges from 200 nm to 1500 nm, which is limited by various process factors. Theoretically, the larger a thickness difference between the first intrinsic layer and the second intrinsic layer is, the better it has. The thinner the intrinsic layer is, the smaller a peak value of the spectral response curve has (the more blue-green light is preferred), and the thicker the intrinsic layer is, the larger the peak value of the spectral response curve has (the more red light is preferred).

Figure 8:
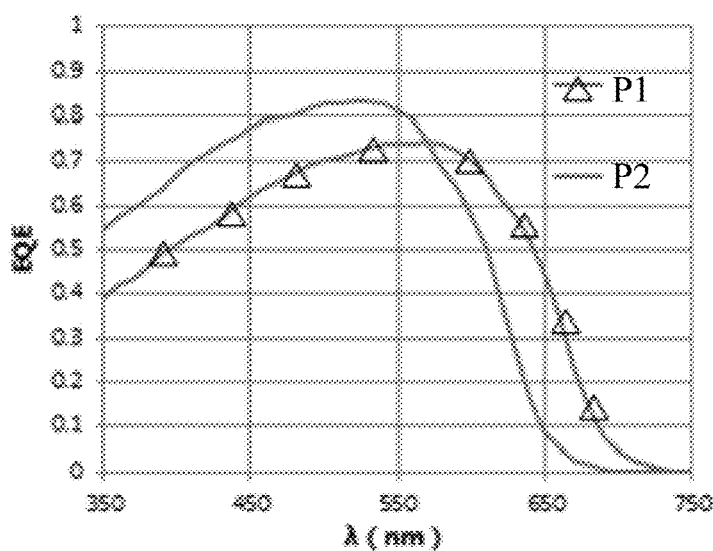
FIG. 8 is a schematic diagram of a still spectral response curve of two kinds of identification pixels according to an exemplary embodiment of the present disclosure.

In this exemplary embodiment, two kinds of identification pixels with different spectral responses are formed by photoelectric conversion layers made of different process parameters. Exemplarily, different process parameters may indicate that the intrinsic layers in different photoelectric conversion layers have different thicknesses. The spectral response curves of two kinds of identification pixels are shown in FIG. 8, where both the first identification pixel P1 and the second identification pixel P2 respond to all visible light bands, and the difference is that there is a difference in their response peak values. An obvious degree of this difference will be affected by the significance of the difference in process parameters. The greater the difference is, the more obvious the difference between each frame image of real fingers has, and the easier it is to distinguish between real and fake fingers.

For this exemplary embodiment, white light mixed with red/green/blue light may be used as the emission light source when distinguishing between real and fake fingerprints, and the response peak values of two kinds of identification pixels are different, which leads to different degrees of dynamic changes of fingerprints in different pixel regions, thus realizing the distinction between real and fake fingers. This embodiment uses the white light source mixed with red/green/blue light, which is especially suitable for the field of mobile phone fingerprints.

Compared with the previous embodiments, the difference degree between pixels with different spectral responses constructed by the difference of process parameters in this exemplary embodiment is not very obvious, but the process difficulty and cost of this construction mode are relatively low, and only a single photoelectric conversion material may be used.

The fingerprint identification substrate provided by the exemplary embodiment of the present disclosure forms two or more kinds of identification pixels by disposing the first photoelectric conversion layer 32a and the second photoelectric conversion layer 32b with different spectral response characteristics to red light or infrared light, which enlarges the sensitivity difference of each region in the fingerprint image to the dynamic change of fingerprints, and improve the security and reliability of fingerprint identification. The embodiment of the present disclosure may effectively solve the deception problem that current optical fingerprint identification products cannot distinguish a fake fingerprint, provide higher security for scenarios such as high-value payment and transfer, and satisfy a customer market demand of the current fingerprint identification products. An implementation of the present disclosure does not relate to an undeveloped process and image comparison algorithm, and is easy to implement.

The fingerprint identification substrate of the embodiment of the present disclosure needs to collect multiple frames of images when determining whether it is a real finger, thus prolonging fingerprint identification time to a certain extent. Taking fingerprints under a screen of a mobile phone as an example, this kind of scenario that needs to distinguish between real and fake fingers is only in some special scenarios that need security authentication, such as high-value payment. In these scenarios, it is acceptable to extend the authentication time appropriately. However, for a situation that generally only needs to be unlocked to use, there is no need to extend the identification time, and the overall customer experience will not be significantly reduced.

The following is an exemplary explanation through a manufacturing process of the fingerprint identification substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the present disclosure. A "thin film" refers to a layer of thin film manufactured by a certain material on a substrate by using deposition, coating or another process. If the "thin film" does not need a patterning process during the whole manufacturing process, the "thin film" can also be called a "layer". If the "thin film" needs a patterning process in the whole manufacturing process, it is referred to as a "thin film" before the patterning process and as a "layer" after the patterning process. The "layer" after the patterning process contains at least one "pattern". In the present disclosure, "A and B are disposed on the same layer" indicates that A and B are simultaneously formed by the same patterning process, and a "thickness" of the film layer is the dimension of the film layer in a direction perpendicular to the fingerprint identification substrate. In the exemplary embodiments of the present disclosure, "an orthogonal projection of A contains an orthogonal projection of B" means that a boundary of the orthogonal projection of B falls within a boundary range of the orthogonal projection of A, or the boundary of the orthogonal projection of A overlaps with the boundary of the orthogonal projection of B.

In an exemplary implementation, a manufacturing process for a fingerprint identification substrate includes the following operations.

Figure 9:
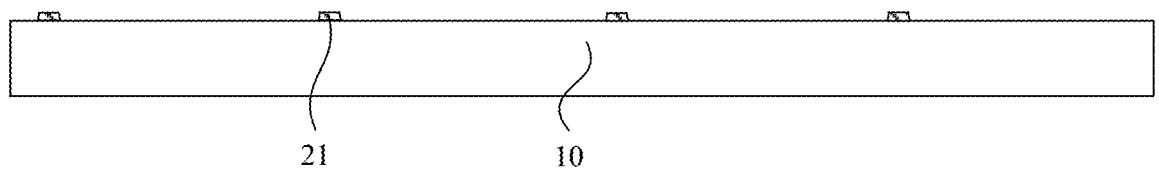
FIG. 9 is a schematic diagram after forming a pattern of a first conductive layer according to an exemplary embodiment of the present disclosure.

(1) A pattern of a first conductive layer is formed. In an exemplary implementation, forming the pattern of the first conductive layer may include: depositing a first metal thin film on a substrate 10, patterning the first metal thin film by a patterning process to form the pattern of the first conductive layer, and the first conductive layer at least includes a scanning signal line 20 (not shown in the drawings) and a gate electrode 21, as shown in FIG. 9.

In an exemplary embodiment, the scanning signal line 20 may extend in a horizontal direction, and a plurality of scanning signal lines 20 are parallel to each other. The gate electrode 21 is disposed in at least one identification pixel, and the gate electrode 21 may be connected with the scanning signal line 20 as an integral structure.

In an exemplary embodiment, the substrate 10 may be a hard substrate or a flexible substrate, such as glass or polyimide (PI). The first metal thin film may be made of metal materials such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb) and may be single-layered structure or multi-layered composite structure, for example Ti/Al/Ti etc.

Figure 10:
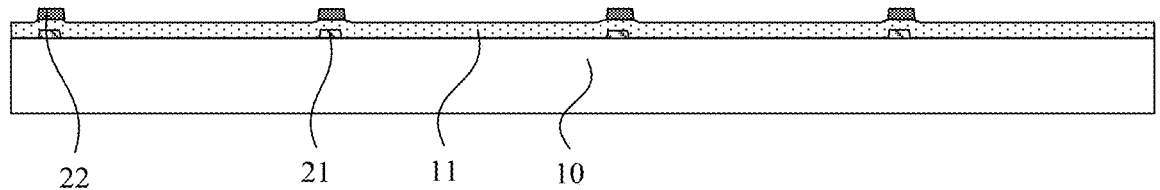
FIG. 10 is a schematic diagram after forming a pattern of a semiconductor layer according to an exemplary embodiment of the present disclosure.

(2) A pattern of a semiconductor layer is formed. In an exemplary implementation, forming the pattern of the semiconductor layer may include: sequentially depositing a first insulating thin film and a semiconductor thin film on the substrate formed with the above pattern, and patterning the semiconductor thin film through a patterning process to form a first insulating layer 11 covering the pattern of the first conductive layer and the pattern of the semiconductor layer disposed on the first insulating layer 11, the pattern of the semiconductor layer includes at least an active layer 22, as shown in FIG. 10.

In an exemplary embodiment, the active layer 22 is disposed in at least one identification pixel, and an orthogonal projection of the active layer 22 on the substrate 10 overlaps with an orthogonal projection of the gate electrode 21 on the substrate 10.

In an exemplary embodiment, the semiconductor thin film may be made of materials such as amorphous indium gallium zinc oxide (a-IGZO), zinc oxynitride (ZnON), indium zinc tin oxide (IZTO), amorphous silicon (a-Si), polycrystalline silicon (p-Si), hexathiophene, or polythiophene. That is, the present disclosure is applicable to transistors that are manufactured based on oxide technology, silicon technology or organic technology. The first insulating layer 11 may made of any one or more of silicon oxide (SiOx), silicon nitride (SiNx) and silicon oxynitride (SiON), and may be a single layer, multiple layers or a composite layer, and the first insulating layer 11 is referred to as a gate insulating (GI) layer.

Figure 11:
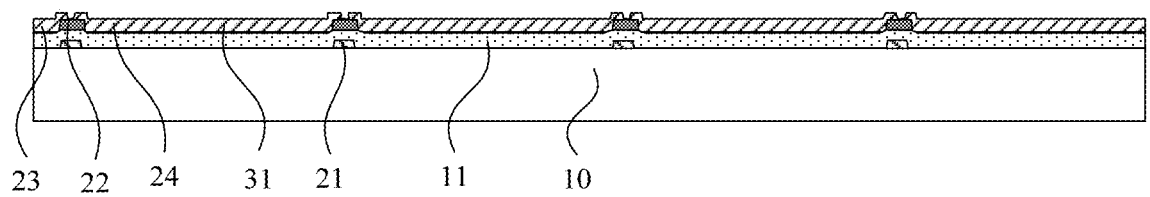
FIG. 11 is a schematic diagram after forming a pattern of a second conductive layer according to an exemplary embodiment of the present disclosure.

(3) A pattern of a second conductive layer is formed. In an exemplary implementation, forming the pattern of the second conductive layer may include: depositing a second metal thin film on the substrate formed with the above patterns, patterning the second metal thin film by a patterning process to form the pattern of the second conductive layer, the second conductive layer includes a data signal line 30 (not shown in the drawings), a source electrode 23, a drain electrode 24 and a first electrode 31, as shown in FIG. 11.

In the exemplary embodiment, the data signal line 30 extends in a vertical direction, and a plurality of data signal lines 30 are parallel to each other. The plurality of scanning signal lines 20 extending in the horizontal direction and the plurality of data signal lines 30 extending the vertical direction intersect each other to define a plurality of identification pixels arranged in a matrix.

In an exemplary embodiment, the source electrode 23, the drain electrode 24 and the first electrode 31 are disposed in at least one identification pixel, the source electrode 23 may be connected with the data signal line 30 as an integrated structure, the drain electrode 24 is disposed opposite to the source electrode 23, the active layer between the source electrode 23 and the drain electrode 24 forms a channel region, and the first electrode 31 is connected with the drain electrode 24.

In an exemplary embodiment, the drain electrode 24 and the first electrode 31 may be an integral structure, that is, the drain electrode of the thin film transistor also serves as a cathode of a PIN junction photodiode.

In an exemplary embodiment, the second metal thin film may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may be a single-layered structure or a multi-layered composite structure, such as Ti/Al/Ti.

So far, a thin film transistor (TFT) as a switch device in the fingerprint identification substrate has been formed on the substrate, the thin film transistor includes the gate electrode 21, the active layer 22, the source electrode 23 and the drain electrode 24.

Figure 12:
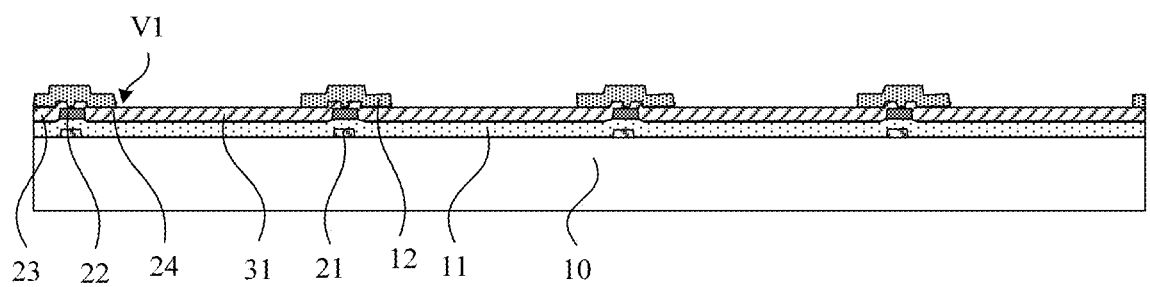
FIG. 12 is a schematic diagram after forming a pattern of a second insulating layer according to an exemplary embodiment of the present disclosure.

(4) A pattern of a second insulating layer is formed. In an exemplary implementation, forming the pattern of the second insulating layer may include: depositing a second insulating thin film on the substrate formed with the above patterns, patterning the second insulating thin film by a patterning process to form the second insulating layer 12 covering the pattern of the second conductive layer. The second insulating layer 12 is provided with a first via hole V1, the first via hole V1 is located in a region where the first electrode 31 is located, and the second insulating layer 12 in the first via hole V1 is etched away, to expose a surface of the first electrode 31, as shown in FIG. 12.

Figure 13:
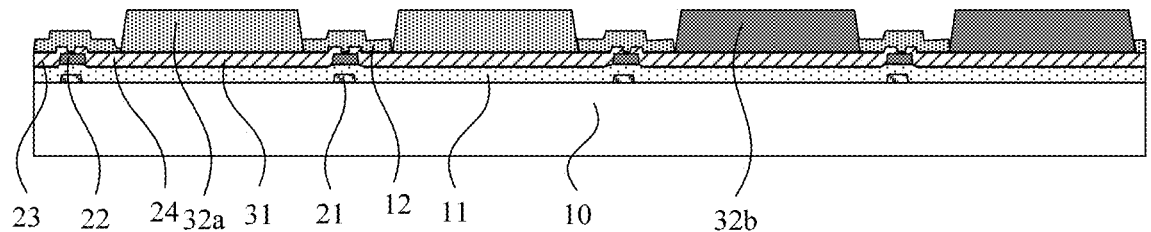
FIG. 13 is a schematic diagram after forming a pattern of a photoelectric conversion layer according to an exemplary embodiment of the present disclosure.

(5) A pattern of a photoelectric conversion layer is formed. In an exemplary implementation, forming the pattern of the photoelectric conversion layer may include: depositing a first photoelectric conversion thin film on the substrate formed with the above patterns, patterning the first photoelectric conversion thin film by a patterning process to form a pattern of a first photoelectric conversion layer 32a; depositing a second photoelectric conversion thin film, patterning the second photoelectric conversion thin film by a patterning process to form a pattern of a second photoelectric conversion layer 32b. The first photoelectric conversion layer 32a and the second photoelectric conversion layer 32b are disposed on the first electrode 31 in the first via hole V1 and connected with the first electrode 31, as shown in FIG. 13.

In this exemplary embodiment, the photoelectric conversion layer 32 includes a first photoelectric conversion layer 32a and a second photoelectric conversion layer 32b, which have different spectral response characteristics to red light or infrared light. In an exemplary embodiment, there may be two or more kinds of identification pixels with different spectral response intervals in the embodiment of the present disclosure. For convenience of understanding, this embodiment only describes two kinds of identification pixels, but it is not limited to two in practice.

In the exemplary embodiment, the photoelectric conversion layer 32 is a main structure of the photodiode, and an orthogonal projection of the photoelectric conversion layer 32 on the substrate 10 does not overlap with an orthogonal projection of the thin film transistor on the substrate 10.

In an exemplary embodiment, the first photoelectric conversion layer 32a is made of a first photoelectric semiconductor material, which responds to all visible light bands. The second photoelectric conversion layer 32b is made of a second photoelectric semiconductor material, which only responds to a blue-green band.

In another exemplary embodiment, the first photoelectric conversion layer 32a is made of the first photoelectric semiconductor material, which responds to all visible light bands; the second photoelectric conversion layer 32b is made of a third photoelectric semiconductor material, which only responds to an infrared band.

Figure 14:
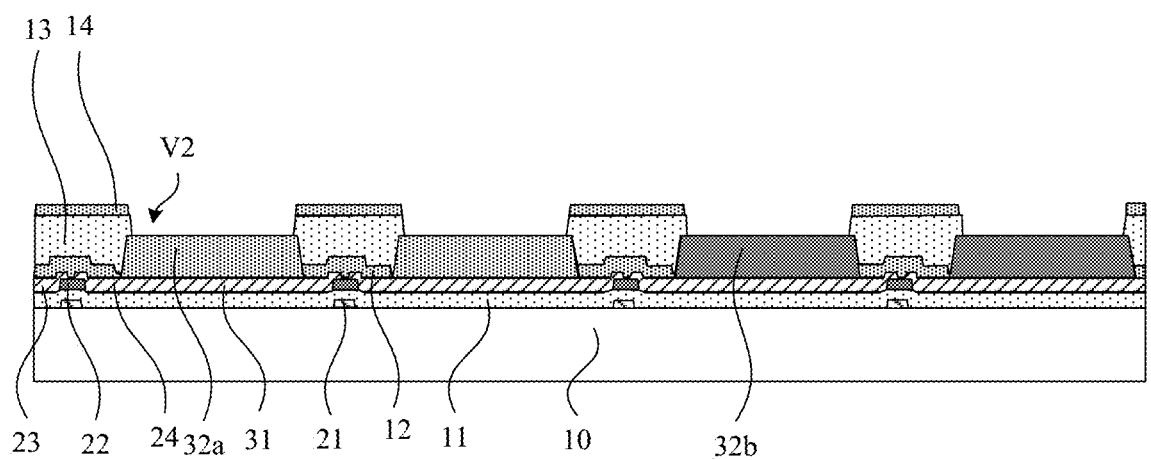
FIG. 14 is a schematic diagram after forming patterns of a flattening layer and a third insulating layer according to an exemplary embodiment of the present disclosure.

(6) Patterns of a flattening layer and a third insulating layer are formed. In an exemplary implementation, patterning the flattening layer and the third insulating layer may include: coating a flattening thin film on the substrate formed with the above patterns, then depositing a third insulating thin film, patterning the third insulating thin film and the flat thin film by a patterning process to form the flattening layer 13 covering the second insulating layer 12 and the photoelectric conversion layer 32 and the third insulating layer 14 disposed on the flattening layer 13. The third insulating layer 14 and the flattening layer 13 are provided with a second via hole V2 located in an region where the photoelectric conversion layer 32 is located, and the third insulating layer 14 and the flattening layer 13 in the second via hole V2 are removed to expose a surface of the photoelectric conversion layer 32, as shown in FIG. 14.

In an exemplary implementation, the flattening layer 13 is used to flatten a film height difference caused by the photoelectric conversion layer 32, so as to avoid poor process caused by excessive climbing of the subsequent films in the deposition process.

In an exemplary implementation, the flattening layer 13 may be made of a resin material, and the third insulating layer 14 may be made of any or more of silicon oxide (SiOx), silicon nitride (SiNx), and silicon oxynitride (SiON), and may be a single layer, multiple layers or a composite layer.

Figure 15:
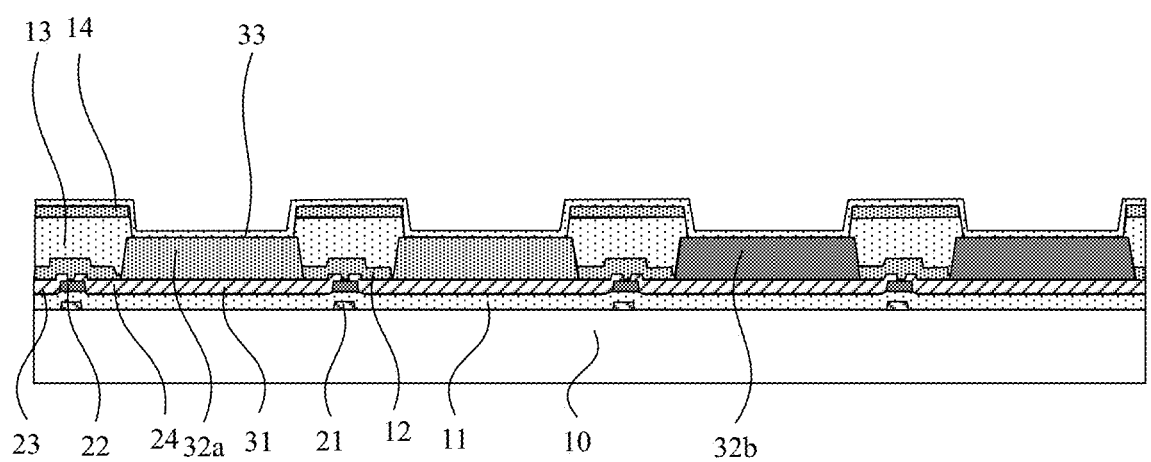
FIG. 15 is a schematic diagram after forming a pattern of a second electrode according to an exemplary embodiment of the present disclosure.

(7) A pattern of a second electrode is formed. In an exemplary implementation, forming the pattern of the second electrode includes: depositing a transparent conductive thin film on the substrate formed with the above patterns, and patterning the transparent conductive thin film through a patterning process to form the pattern of the second electrode 33 on the third insulating layer 14, the second electrode 33 is connected with an anode of the photoelectric conversion layer 32 through the second via hole V2, as shown in FIG. 15.

In an exemplary implementation, a transparent conductive material may be indium tin oxide (ITO) or indium zinc oxide (IZO).

So far, a photodiode (Photo-Diode) as a photosensitive device in the fingerprint identification substrate has been formed on the substrate. A PIN-type photodiode includes a first electrode 31, a photoelectric conversion layer 32 and a second electrode 33, and the photodiode is used for photoelectric conversion of incident light. In an exemplary embodiment, the thin film transistor as a switching device and the PIN-type photodiode as a photosensitive device together constitute a fingerprint sensing layer of the fingerprint identification substrate, and the thin film transistor controls readout of electrical signals in the photodiode.

In an exemplary implementation, a thickness of the substrate 10 is about 120 μm to 150 μm, and a thickness of the fingerprint sensing layer is about 3 μm to 5 μm.

(8) A pattern of a power supply line is formed. In an exemplary implementation, forming the pattern of the power supply line may include: depositing a third metal thin film on the substrate formed with the above patterns, patterning the third metal thin film by a patterning process to form the power supply line 34 on the second electrode 33, as shown in FIG. 16.

In an exemplary implementation, the power supply line 34 is directly connected with the second electrode 33, and a bias voltage provided by the power supply line 34 is transmitted to the second electrode 33. Since the second electrode 33 is made of a transparent conductive material, and has a larger resistivity, the bias voltage provided by the power supply line 34 with a smaller resistivity may ensure that each identification pixel of the fingerprint identification substrate has a uniform bias voltage, which may ensure uniformity of the identification performance of the fingerprint identification substrate.

In an exemplary implementation, an orthogonal projection of the power supply line 34 on the substrate 10 contains an orthogonal projection of a channel region of the active layer on the substrate 10. As the power supply line 34 is opaque, it may be used as a light shielding layer to prevent the channel region of the thin film transistor from being exposed to light to generate a large leakage current, thus ensuring the electrical performance of the thin film transistor.

In an exemplary embodiment, the third metal thin film may be made of metal materials such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may be single-layered structure or multi-layered composite structure, for example Ti/Al/Ti etc.

(9) A pattern of a fourth insulating layer is formed. In an exemplary implementation, forming the pattern of the fourth insulating layer may include: depositing a fourth insulating thin film on the substrate formed with the above patterns, and patterning a fourth insulating thin film by a patterning process to form the pattern of the fourth insulating layer 15 covering the patterns of the power supply line 34 and the second electrode 33, as shown in FIG. 2.

The fourth insulating layer 15 may be made of any one or more of silicon oxide (SiOx), silicon nitride (SiNx) and silicon oxynitride (SiON), and may be a single layer, multiple layers or a composite layer.

The above description is only an exemplary example of manufacturing the fingerprint identification substrate, and the present disclosure is not limited to this. In practice, the manufacturing process may be adjusted if required.

It may be seen from the structure and manufacturing flow of the fingerprint identification substrate described above that the fingerprint identification substrate provided by the exemplary embodiment of the present disclosure forms two or more kinds of identification pixels by disposing the first photoelectric conversion layer 32a and the second photoelectric conversion layer 32b with different spectral response characteristics to red light or infrared light, which enlarges the sensitivity difference of each region in the fingerprint image to the dynamic changes of fingerprints, improves the security and reliability of fingerprint identification, and has a good application prospect. The fingerprint identification substrate provided by the embodiment of the present disclosure has a manufacturing process that is well compatible with the existing manufacturing process, simple process realization, easy implementation, high production efficiency, low production cost, and high yield rate.

An exemplary embodiment of the present disclosure further provides a display apparatus which includes the fingerprint identification substrate of the above embodiments. In an exemplary implementation, the display apparatus may include the fingerprint identification substrate and an organic light-emitting diode (OLED) display substrate, the fingerprint identification substrate is attached to a back of the OLED display substrate through optical adhesive, that is, the OLED display substrate is disposed on a side of the fourth insulating layer 15 of the fingerprint identification substrate. In an exemplary implementation, the display apparatus includes a plurality of display pixels, and each display pixel is disposed in one-to-one correspondence with each identification pixel in a direction perpendicular to the substrate. When operating, the OLED is used as a light source to emit light to the fingerprint, and reflection intensity of the fingerprint valley/ridge to light is different, which leads to different intensities of light directed to the fingerprint identification substrate, thus distinguishing fingerprint lines.

In an exemplary embodiment, the display apparatus may be any product or component with a display function such as a mobile phone, a tablet computer, a TV set, a display, a notebook computer, a digital photo frame, a navigator, etc.

An embodiment of the present disclosure provides a manufacturing method for a fingerprint identification substrate to manufacture the fingerprint identification substrate of the above embodiments. In an exemplary implementation, as shown in FIG. 17, the manufacturing method for the fingerprint identification substrate may include the following steps: Step S1 and Step S2.

Step S1 includes forming a thin film transistor, a first photodiode and a second photodiode on a substrate, the first photodiode including a first electrode, a first photoelectric conversion layer and a second electrode, and the second photodiode including the first electrode, a second photoelectric conversion layer and the second electrode, and the first photoelectric conversion layer and the second photoelectric conversion layer having different spectral response characteristics to red light or infrared light.

Step S2 includes forming a power supply line on the second electrode.

In an exemplary implementation, the forming a thin film transistor, a first photodiode and a second photodiode on a substrate includes: forming a first conductive layer on the substrate, the first conductive layer including a gate electrode; forming a first insulating layer and an active layer on the first conductive layer; forming a second conductive layer on the active layer, the second conductive layer including a source electrode, a drain electrode and the first electrode, and the gate electrode, the active layer, the source electrode and the drain electrode constituting a thin film transistor; forming a second insulating layer on the second conductive layer, the second insulating layer being provided with a via hole exposing a surface of the first electrode; forming the first photoelectric conversion layer and the second photoelectric conversion layer on the second insulating layer, the first photoelectric conversion layer being connected with the first electrode through the via hole on the second insulating layer; forming a flattening layer, a third insulating layer and the second electrode on the first photoelectric conversion layer and the second photoelectric conversion layer, the second electrode being connected with the first photoelectric conversion layer and the second photoelectric conversion layer through a via hole penetrating through the flattening layer and the third insulating layer, and the first electrode, the first photoelectric conversion layer and the second electrode constituting the first photodiode, and the first electrode, the second photoelectric conversion layer and the second electrode constituting the second photodiode.

In an exemplary implementation, the first photoelectric conversion layer responds to all visible light bands; the second photoelectric conversion layer only responds to a blue-green band.

In an exemplary implementation, the first photoelectric conversion layer responds to all visible light bands; the second photoelectric conversion layer only responds to an infrared band.

In an exemplary implementation, the first photoelectric conversion layer responds to all visible light bands, and the second photoelectric conversion layer responds to all visible light bands, and a response peak value of the first photoelectric conversion layer is different from a response peak value of the second photoelectric conversion layer.

The contents of the manufacturing method for the fingerprint identification substrate according to the exemplary embodiment of the present disclosure have been described in detail in the manufacturing process of the above fingerprint identification substrate, and will not be described in detail here.

The manufacturing method for the fingerprint identification substrate provided by the embodiment of the present disclosure forms two or more kinds of identification pixels are by disposing the first photoelectric conversion layer and the second photoelectric conversion layer with different spectral response characteristics to red light or infrared light, which enlarges the sensitivity difference of each region in the fingerprint image to the dynamic changes of fingerprints, improves the security and reliability of fingerprint identification. The manufacturing method for the fingerprint identification substrate provided by the embodiment of the present disclosure has a manufacturing process that is well compatible with the existing manufacturing process, simple process realization, easy implementation, high production efficiency, low production cost, and high yield rate.

Figure 18:
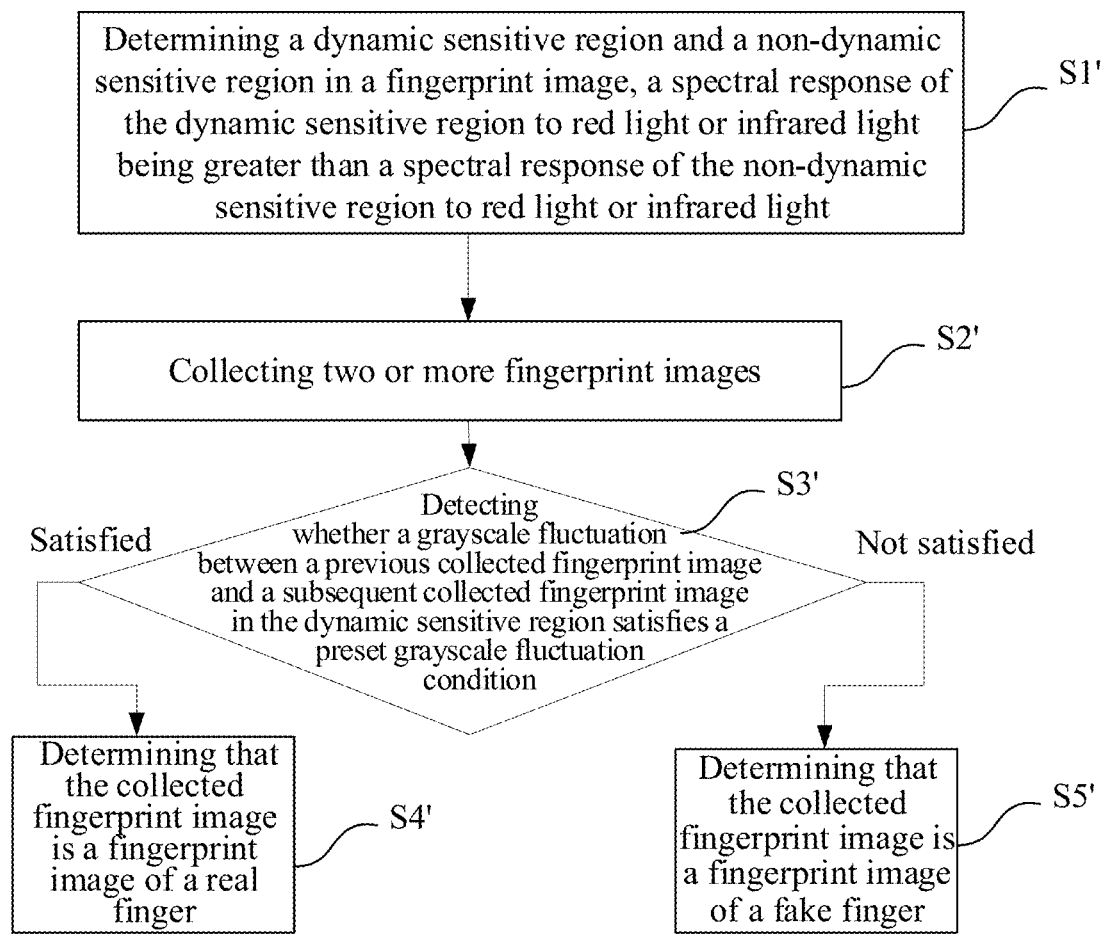
FIG. 18 is a flowchart of an identification method for a fingerprint identification substrate according to an exemplary embodiment of the present disclosure.

Embodiments of the present disclosure also provide a identification method for a fingerprint identification substrate, which is used for fingerprint identification by using the fingerprint identification substrate of the above exemplary embodiment. In an exemplary embodiment, as shown in FIG. 18, the identification method for the fingerprint identification substrate may include the following steps: step S1', step S2', step S3', step S4', and step S5'.

Step S1' includes determining a dynamic sensitive region and a non-dynamic sensitive region in a fingerprint image, a spectral response of the dynamic sensitive region to red light or infrared light being greater than a spectral response of the non-dynamic sensitive region to red light or infrared light.

Step S2' includes collecting two or more fingerprint images.

Step S3' includes detecting whether a grayscale fluctuation between a previous collected fingerprint image and a subsequent collected fingerprint image in the dynamic sensitive region satisfies a preset grayscale fluctuation condition.

Step S4' includes determining that the collected fingerprint image is a fingerprint image of a real finger when the preset grayscale fluctuation condition is satisfied.

Step S5' includes determining that the collected fingerprint image is a fingerprint image of a fake finger when the preset grayscale fluctuation condition is not satisfied.

In an exemplary embodiment, the preset grayscale fluctuation conditions may include: grayscale fluctuation values between the subsequent collected fingerprint image and the previous collected fingerprint image in the dynamic sensitive region are greater than or equal to a first grayscale fluctuation threshold; or grayscale values of continuously collected multiple frames of the fingerprint images having a periodic grayscale vibration consistent with a pulse vibration frequency.

Exemplarily, as shown in FIG. 4, a second subsequent collected fingerprint image to a fourth subsequent collected fingerprint image may be compared with a first fingerprint image one by one, and it is detected whether the grayscale fluctuation value between the subsequent collected fingerprint image and the previous collected fingerprint image in the dynamic sensitive region is greater than the first grayscale fluctuation threshold. Alternatively, among every two consecutive fingerprint images, a subsequent collected fingerprint image may be compared with a previous collected fingerprint image, and it is detected whether the grayscale fluctuation value between the subsequent collected fingerprint image and the previous collected fingerprint image in the dynamic sensitive region is greater than or equal to the first grayscale fluctuation threshold. If the grayscale fluctuation value between the subsequent collected fingerprint image and the previous collected fingerprint image in the dynamic sensitive region is smaller than the first grayscale fluctuation threshold, it is determined that the collected fingerprint image is a fingerprint image of a fake finger.

Alternatively, it may be detected that the grayscale values of four continuously collected fingerprint images have the periodic grayscale vibration consistent with the pulse vibration frequency, and if it exists, it is determined that the collected fingerprint image is the fingerprint image of the real finger; if it does not exist, it is determined that the collected fingerprint image is the fingerprint image of the fake finger.

The identification method for the fingerprint identification substrate provided by the embodiment of the present disclosure performs fingerprint identification through two or more kinds of identification pixels with different spectral response characteristics, which enlarges the sensitivity difference of each region in the fingerprint image to the dynamic changes of fingerprints and improves the security and reliability of fingerprint identification.

Although the embodiments disclosed in the present disclosure are as described above, the described contents are only the embodiments for facilitating understanding of the present disclosure, which are not intended to limit the present disclosure. Any person skilled in the art to which the present disclosure pertains may make any modifications and variations in the forms and details of implementation without departing from the spirit and the scope of the present disclosure, but the patent protection scope shall still be subject to the scope defined in the appended claims.

What we claim is:

1. A fingerprint identification substrate, comprising a substrate, and a plurality of scanning signal lines, a plurality of data signal lines and at least two kinds of identification pixels disposed on the substrate, the at least two kinds of identification pixels comprising a first identification pixel and a second identification pixel, and the first identification pixel comprising a first photodiode and the second identification pixel comprising a second photodiode, wherein:
the first photodiode comprises a first electrode, a first photoelectric conversion layer and a second electrode, and the second photodiode comprises the first electrode, a second photoelectric conversion layer and the second electrode; and
the first photoelectric conversion layer and the second photoelectric conversion layer have different spectral response characteristics to red light or infrared light to enlarge sensitivity difference of each region in a fingerprint image to dynamic changes of a fingerprint;
wherein the fingerprint identification substrate further comprises: an integrated circuit connected with the scanning signal lines and the data signal lines, and the integrated circuit is configured to:
determine a dynamic sensitive region and a non-dynamic sensitive region in a fingerprint image, a spectral response of the dynamic sensitive region to red light or infrared light being greater than a spectral response of the non-dynamic sensitive region to the red light or the infrared light;
collect two or more fingerprint images;
detected whether a grayscale fluctuation between a subsequent collected fingerprint image and a previous collected fingerprint image in the dynamic sensitive region satisfies a preset grayscale fluctuation condition;
determine that the collected fingerprint image is a fingerprint image of a real finger when the preset grayscale fluctuation condition is satisfied; and
determine that the collected fingerprint image is a fingerprint image of a fake finger when the preset grayscale fluctuation condition is not satisfied.

2. The fingerprint identification substrate according to claim 1, wherein the first photoelectric conversion layer responds to all visible light bands; and the second photoelectric conversion layer only responds to a blue-green band.

3. The fingerprint identification substrate according to claim 2, wherein the first photoelectric conversion layer comprises a first doped layer, an intrinsic layer and a second doped layer which are stacked, wherein
the first doped layer is made of P-type doped amorphous silicon or polycrystalline silicon, and the second doped layer is made of N-type doped amorphous silicon or polycrystalline silicon; or
the first doped layer is made of N-type doped amorphous silicon or polycrystalline silicon, and the second doped layer is made of P-type doped amorphous silicon or polycrystalline silicon;
wherein the second photoelectric conversion layer is made of perovskite material.

4. The fingerprint identification substrate according to claim 1, wherein the first photoelectric conversion layer responds to all visible light bands; and the second photoelectric conversion layer only responds to an infrared band.

5. The fingerprint identification substrate according to claim 4, wherein the first photoelectric conversion layer comprises a first doped layer, an intrinsic layer and a second doped layer which are stacked, wherein
the first doped layer is made of P-type doped amorphous silicon or polycrystalline silicon, and the second doped layer is made of N-type doped amorphous silicon or polycrystalline silicon; or
the first doped layer is made of N-type doped amorphous silicon or polycrystalline silicon, and the second doped layer is made of P-type doped amorphous silicon or polycrystalline silicon;
wherein the second photoelectric conversion layer is made of a derivative of near infrared fluorescent dye or full carbon molecular material.

6. The fingerprint identification substrate according to claim 1, wherein the first photoelectric conversion layer responds to all visible light bands, the second photoelectric conversion layer responds to all visible light bands, and a response peak value of the first photoelectric conversion layer is different from a response peak value of the second photoelectric conversion layer.

7. The fingerprint identification substrate according to claim 6, wherein the first photoelectric conversion layer comprises a first doped layer, a first intrinsic layer and a second doped layer which are stacked, wherein the first doped layer is made of P-type doped amorphous silicon or polycrystalline silicon, and the second doped layer is made of N-type doped amorphous silicon or polycrystalline silicon; or the first doped layer is made of N-type doped amorphous silicon or polycrystalline silicon, and the second doped layer is made of P-type doped amorphous silicon or polycrystalline silicon;

wherein the second photoelectric conversion layer comprises a third doped layer, a second intrinsic layer and a fourth doped layer which are stacked, wherein the third doped layer is made of P-type doped amorphous silicon or polycrystalline silicon, and the fourth doped layer is made of N-type doped amorphous silicon or polycrystalline silicon; or the third doped layer is made of N-type doped amorphous silicon or polycrystalline silicon, and the fourth doped layer is made of P-type doped amorphous silicon or polycrystalline silicon;

wherein the first intrinsic layer and the second intrinsic layer have different thicknesses.

8. A display apparatus, comprising the fingerprint identification substrate according to claim 1.

9. The display apparatus according to claim 8, wherein the first photoelectric conversion layer responds to all visible light bands; the second photoelectric conversion layer only responds to a blue-green band.

10. The display apparatus according to claim 9, wherein the first photoelectric conversion layer comprises a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or the first doped layer is made of N-type doped amorphous silicon or polycrystalline silicon, and the second doped layer is made of P-type doped amorphous silicon or polycrystalline silicon;

wherein the second photoelectric conversion layer is made of perovskite material.

11. The display apparatus according to claim 8, wherein the first photoelectric conversion layer responds to all visible light bands; and the second photoelectric conversion layer only responds to an infrared band.

12. The display apparatus according to claim 11, wherein the first photoelectric conversion layer comprises a first doped layer, an intrinsic layer and a second doped layer which are stacked, wherein the first doped layer is made of P-type doped amorphous silicon or polycrystalline silicon, and the second doped layer is made of N-type doped amorphous silicon or polycrystalline silicon; or the first doped layer is made of N-type doped amorphous silicon or polycrystalline silicon, and the second doped layer is made of P-type doped amorphous silicon or polycrystalline silicon;

wherein the second photoelectric conversion layer is made of a derivative of near infrared fluorescent dye or full carbon molecular material.

13. The display apparatus according to claim 8, wherein the first photoelectric conversion layer responds to all visible light bands, the second photoelectric conversion layer responds to all visible light bands, and a response peak value of the first photoelectric conversion layer is different from a response peak value of the second photoelectric conversion layer.

14. The display apparatus according to claim 13, wherein the first photoelectric conversion layer comprises a first doped layer, a first intrinsic layer and a second doped layer which are stacked, wherein the first doped layer is made of P-type doped amorphous silicon or polycrystalline silicon, and the second doped layer is made of N-type doped amorphous silicon or polycrystalline silicon; or the first doped layer is made of N-type doped amorphous silicon or polycrystalline silicon, and the second doped layer is made of P-type doped amorphous silicon or polycrystalline silicon;

wherein the second photoelectric conversion layer comprises a third doped layer, a second intrinsic layer and a fourth doped layer which are stacked, wherein the third doped layer is made of P-type doped amorphous silicon or polycrystalline silicon, and the fourth doped layer is made of N-type doped amorphous silicon or polycrystalline silicon; or the third doped layer is made of N-type doped amorphous silicon or polycrystalline silicon, and the fourth doped layer is made of P-type doped amorphous silicon or polycrystalline silicon;

wherein the first intrinsic layer and the second intrinsic layer have different thicknesses.

* * * * *